United States Patent
Ng et al.

(10) Patent No.: US 6,998,884 B2
(45) Date of Patent: Feb. 14, 2006

(54) CIRCUIT FOR AUTO-CLAMPING INPUT PINS TO A DEFINITE VOLTAGE DURING POWER-UP OR RESET

(75) Inventors: Philip S. Ng, Cupertino, CA (US); Jeff Ming-Hung Tsai, Santa Clara, CA (US); Johnny Chan, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/749,342

(22) Filed: Dec. 31, 2003

(65) Prior Publication Data

US 2005/0140419 A1   Jun. 30, 2005

(51) Int. Cl.
*H03L 7/00* (2006.01)

(52) U.S. Cl. ...................................... 327/143; 327/198
(58) Field of Classification Search ................ 327/142, 327/143, 198, 318, 327, 328
See application file for complete search history.

(56) References Cited

U.S. PATENT DOCUMENTS

| | | | |
|---|---|---|---|
| 5,017,813 A | 5/1991 | Galbraith et al. ........... 307/475 |
| 5,159,206 A | 10/1992 | Tsay et al. ................ 307/272.3 |
| 5,500,611 A | 3/1996 | Popat et al. .................. 326/87 |
| 6,160,429 A | 12/2000 | Morrill ........................ 327/143 |
| 6,335,648 B1 | 1/2002 | Matsushita .................. 327/198 |
| 6,384,646 B1 * | 5/2002 | Ozawa ........................ 327/143 |
| 6,509,768 B1 | 1/2003 | Polizzi et al. ................ 327/143 |
| 6,650,155 B1 | 11/2003 | Nguyen et al. ............. 327/143 |
| 2003/0214337 A1 | 11/2003 | Miyagi ....................... 327/215 |

* cited by examiner

*Primary Examiner*—Kenneth B. Wells
(74) *Attorney, Agent, or Firm*—Schneck & Schneck; Thomas Schneck; Mark Protsik

(57) ABSTRACT

An auto-grounding circuit responsive to a reset signal discharges an input terminal of an integrated circuit and its associated input line to ground, using a pull-down transistor coupled to the input line, with a gate of the pull-down transistor coupled to receive the reset signal. An exemplary circuit also includes a NAND gate and a second pull-down transistor to maintain an established voltage level of the input line after the reset signal is no longer asserted until the input terminal is driven by an applied input signal. The voltage maintaining circuitry is weaker than the main pull-down transistor to avoid interfering with normal operation of the input terminal.

6 Claims, 3 Drawing Sheets

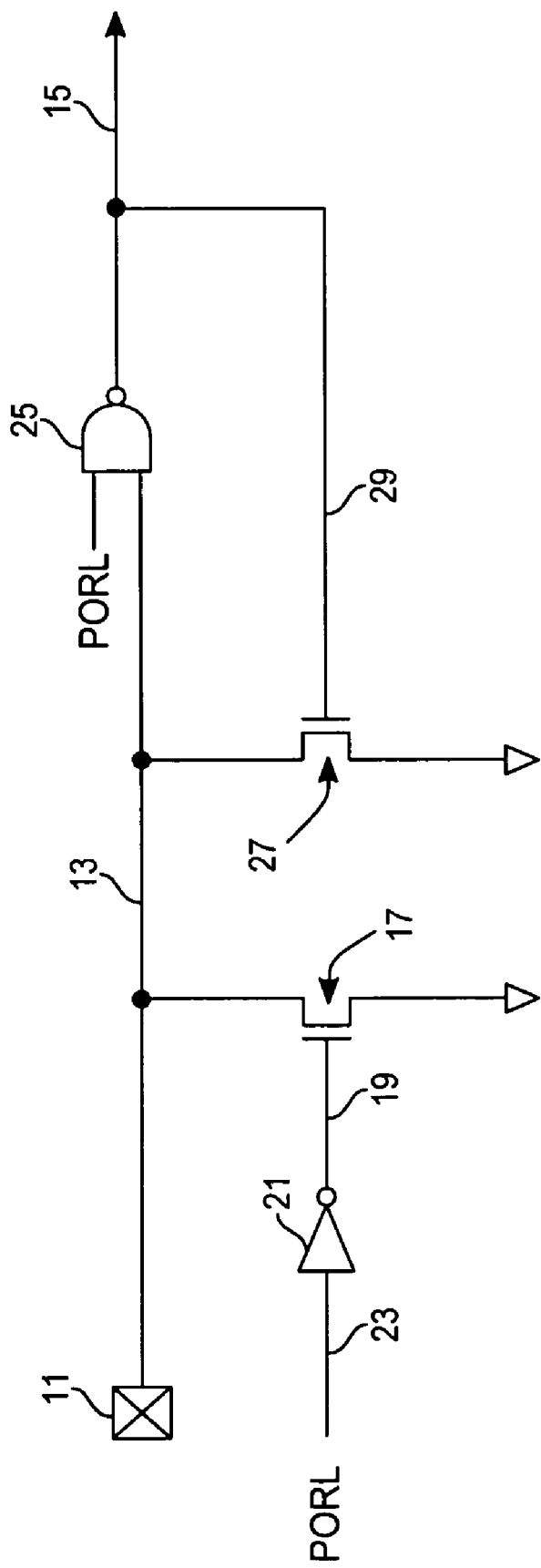
Fig._1

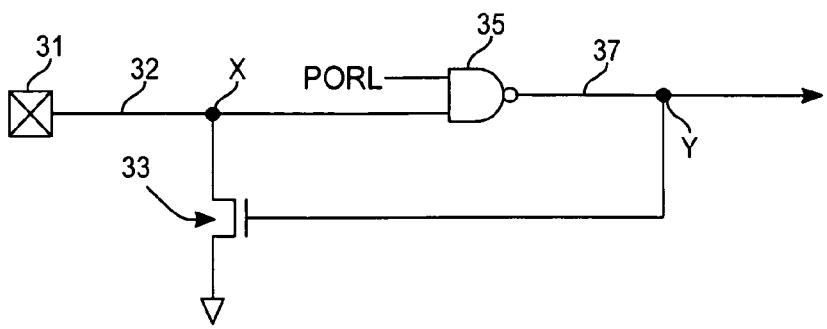
Fig._2
(Prior Art)
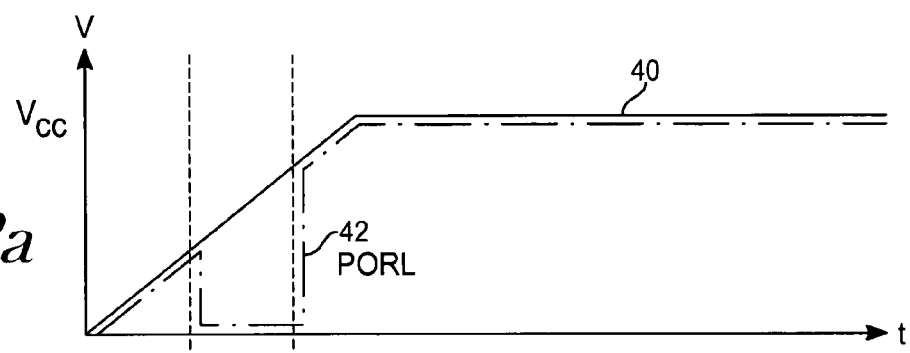
Fig._3a
(Prior Art)
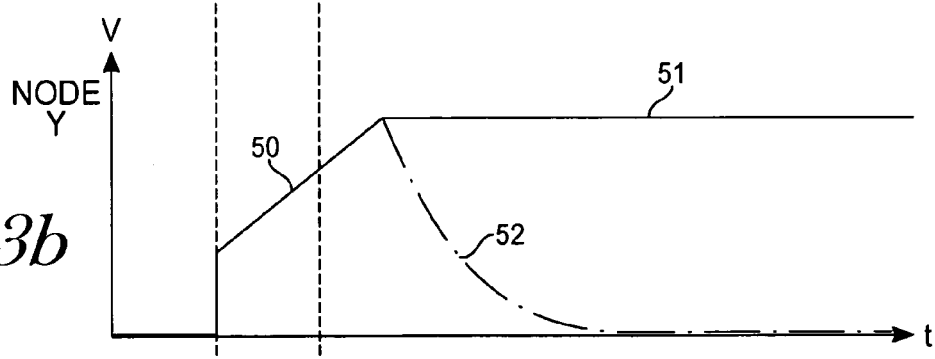
Fig._3b
(Prior Art)
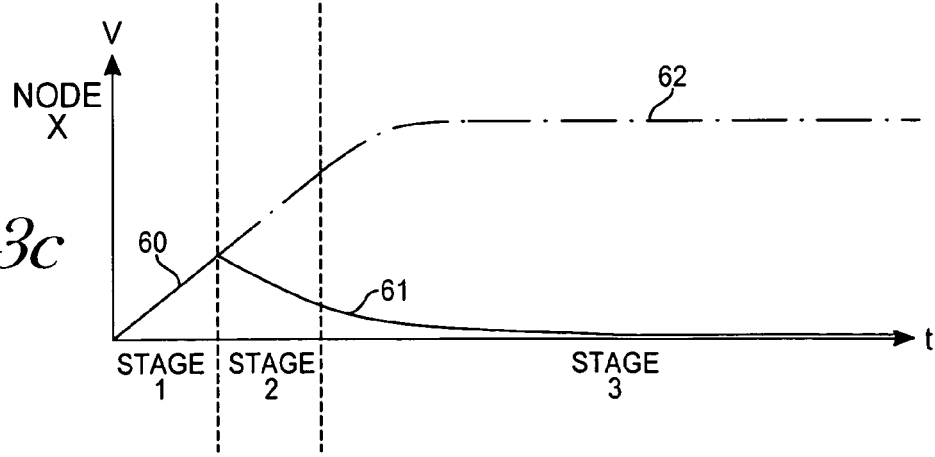
Fig._3c
(Prior Art)

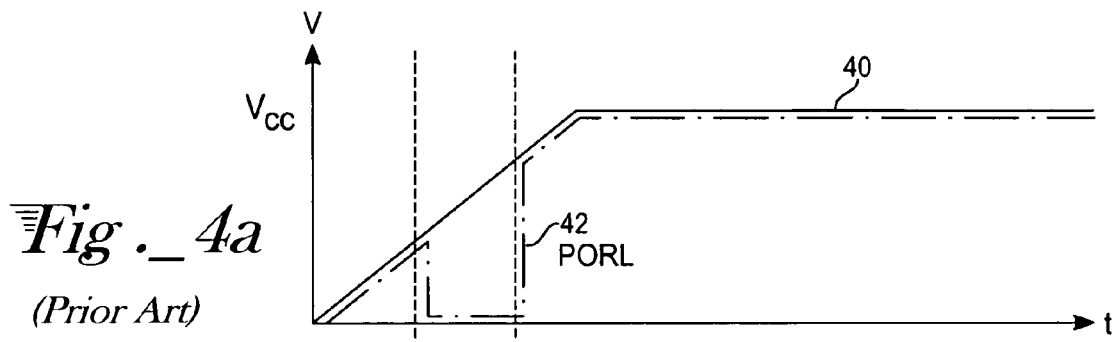
Fig._4a
(Prior Art)
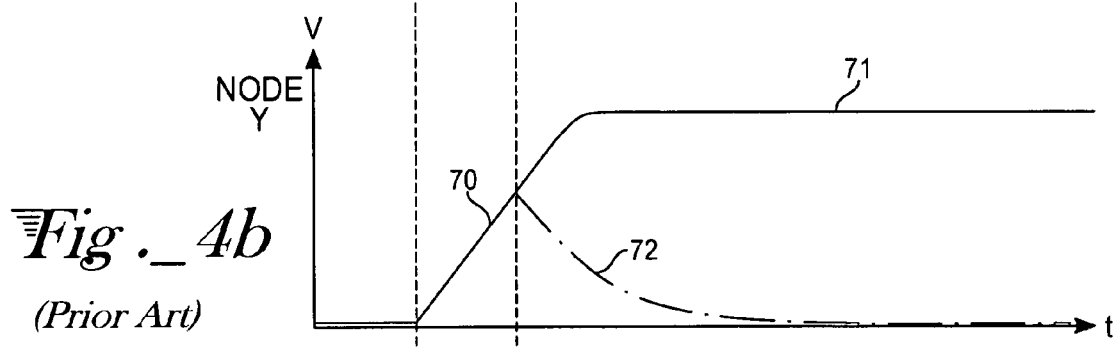
Fig._4b
(Prior Art)
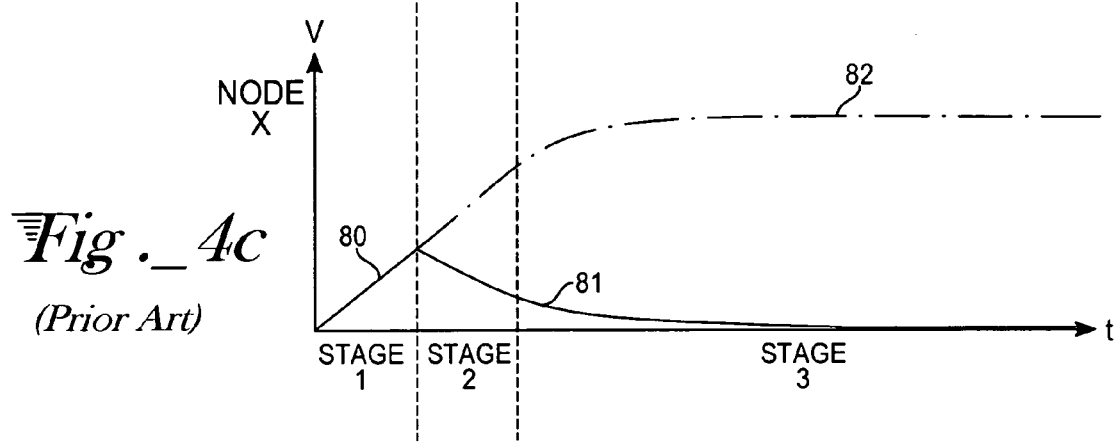
Fig._4c
(Prior Art)

CIRCUIT FOR AUTO-CLAMPING INPUT PINS TO A DEFINITE VOLTAGE DURING POWER-UP OR RESET

TECHNICAL FIELD

The present invention relates to initializing or resetting an integrated circuit to a definite predetermined state, and relates especially to ensuring the initial or reset state of input terminals and of internal latches coupled to such terminals.

BACKGROUND ART

In memory devices and other integrated circuits, it is often desired or necessary to initialize or reset the circuitry, which may include setting internal latches to a definite state. The input pins may be configured by the end user to be in a logic state "1" (electrically connected to a voltage Vcc), to be in a logic state "0" (electrically connected to a ground potential), or to be left floating. In the case in which the input is configured in a logic state "1", then a circuit is used to make sure that the input is automatically tied to Vcc during the power on reset function of the device. In the cases where the input is configured in a logic state "0" or is floating, then a circuit is used to make sure that the input is automatically tied to ground during the power on reset function of the device.

In the prior art, circuits having internal paths from the input line through a resistor to another Vcc or ground have been effective for setting the internal latches to the correct state. However, a problem can occur in some conditions using these circuits in that a current can flow back to the input pin. This problem occurs when the input pin is to be tied to ground but the internal path is coupled to Vcc and also when the input pin is tied to Vcc but the internal path is coupled to ground. Thus there is a current flowing, and power is consumed, even when the device is not in operation. This power consumption is a problem, especially when the integrated circuit is installed in an end product such as a cellular phone that has batteries, in that the battery life is shortened.

One solution in the prior art to correct this problem has been to employ a latch circuit, as for example that shown in FIG. 2, which effectively eliminates the standby current. However, it has been found that typical latch circuits for automatically connected the input pin to the desired state ("0" or "1" or "floating") do not operate correctly for every possible situation. For example, the graphs in FIGS. 3a–3c, show the case in which the latch in FIG. 2 has its input pins 31 is tied to Vcc through a capacitor (which is generally the case when the input pin is floating). In this case it is desired that the autoground function of transistor 33 be operational during and after power-on reset. For this to occur, the output 37 of the NAND gate 35 at node Y must be a logic "1", in order to turn on NMOS transistor 33 and pull the input line 32 at node X down to a ground potential. The input line 32 is one input to the NAND gate 35 while the other input is the power on reset signal (PORL) which is an active low signal. Referring to the graphs in FIGS. 3a–3c: During stage 1 of operation input Vcc 40 is increasing, the power on reset PORL signal (curve 42) is ramping up to a logic "1". The voltage (curve 50) at Node Y is at logic "0", and the voltage (curve 60) at node X is tracking the Vcc. When the PORL signal is applied (stage 2 of the graphs), then the PORL signal goes low, and Vcc 40 continues to increase. The effect on Nodes X and Y will be dependent on whether the pull-down transistor 33 is strong enough to pull down the voltage on the input line 32 to a voltage corresponding to the logic level "0" for the NAND gate 35. When the transistor 33 is a strong pull-down transistor, then in stage 2 of the graphs, the node X goes according to curve 61 pulling down to a logic "0" voltage level. According to the truth table for a NAND gate, in stage 2, the power on reset PORL signal is low, which guarantees that the output of the NAND gate (node Y) will be "1", regardless of the voltage at node X. However, in stage 3, when the PORL signal turns off (goes high) then the voltage at node Y will be dependent on the voltage at node X. In the case of a strong pull-down transistor 33, node X will be pulled down to "0" (curve 61), resulting in node Y going to "1" (curve 51). This is a desired result, as the autoground circuit will work properly. However, if the transistor 33 is a weak pull down, then the Vcc will pull node X up to a high ("1") value (curve 62), which results in the node Y becoming a "0" (curve 52). This is not desired, as this just latches in a "0" and the transistor 33 turns off, keeping node X at a high voltage logic level, and preventing the autoground circuit from functioning.

In another example, the graph in FIGS. 4a–4c show the case in which the latch in FIG. 2 has its input pin tied to Vcc through a resistor (which is generally the case when the input pin is tied to Vcc). In this case, it is desired that the autoground function through transistor 33 not be operational during and after power-on reset. (In this case, we want an "autoVCC" instead). For this to occur, the output 37 of the NAND gate 35 at node Y must be a logic "0", in order to turn off NMOS transistor 33 so that the input line at node X is pulled up to a high voltage potential (Vcc). One input 33 to the NAND gate 35 is the voltage value at node X, while the other input is the power on reset signal (PORL) which is an active low signal. Referring to the graphs in FIGS. 4a–4c: During stage 1 of the operation (before the PORL signal), input Vcc 40 is increasing, the power on reset signal 42 is ramping up to a logic "1". The voltage at Node Y 50 is at logic "0", and the voltage at node "X" 80 is tracking the Vcc. When the PORL signal 42 is applied (stage 2 of the graphs), then the PORL signal goes low, and Vcc 40 continues to increase. The effect on Nodes X and Y will be dependent on whether the pull-down transistor 33 is strong enough to pull down the voltage on the input line to a voltage corresponding to the logic level "0" for the NAND gate. When the transistor 33 is a strong pull-down transistor, then in stage 2 of the graphs, the node X goes according to curve 81 pulling down to a logic "0" voltage level. According to the truth table for a NAND gate, in stage 2, the power on reset signal is low, which guarantees that the output of the NAND gate (node Y) will be "1", regardless of the voltage at node X. However in stage 3, when the PORL signal turns off (goes high) then the voltage at node Y will be dependent on the voltage at node X. In the case of a strong pull-down transistor 33, node X will be pulled down to "0" (curve 81), resulting in node Y going to "1" (curve 71). This is not the desired result, as the Vcc circuit will not work properly, as the transistor 33 is pulling the input line 32, down to a ground potential. Thus, in the case when the transistor is a strong pull down, the auto Vcc circuit does not operate properly.

In U.S. Patent Application Publication U.S. 2003/0214337A1, Miyagi attempts to the avoid the problem of reliable resetting of latches during power-on, by providing an RS latch with a depletion-type MIS transistor to ensure that it always starts in a specified state.

Another way to solve this problem is to require end-user customers to ground otherwise unconnected input pins. But since it is normally desired to give customers flexibility as to how to connect (or not connect) the input pins, requiring the customer to ground all unused input pins is not a desired solution to this problem.

In U.S. Pat. No. 6,335,648, Matsushita describes one attempt at enhancing the stability of integrated circuits in a reset condition. It uses an RS flip-flop that is actively set by a reset signal, and whose output is applied to an n-channel pull-down transistor coupled through a resistor between an output NODE and ground. Additional circuitry, including an OR gate coupled to inverting buffers, is used for resetting the flip-flop so that it does not interfere with normal operation after the reset condition has concluded. However, a simpler circuit is desired.

It is desired to have input pins be tied automatically to a definite voltage potential during a reset condition, in order to avoid the problems noted above, without taking away customer flexibility as to how to use the input pins in normal operation. It is desired that such an auto-clamping circuit be relatively simple in construction, work in every situation (input pin grounded, tied to the Vcc power supply or left floating) without relying on the strength of a latch's pull-down transistor, and not draw unnecessary current and power.

DISCLOSURE OF THE INVENTION

The invention is a circuit for automatically clamping the input terminal and its associated input line to a definite voltage potential in response to a reset signal. The circuit uses an electronic switching means, such as a transistor whose gate is coupled to receive the reset signal, to actively couple the input line to a voltage supply line (Vcc or ground) so that it is not at an unspecified floating voltage. As a result, any input terminal which is unconnected, and therefore would be otherwise left floating, will be now be at a valid digital state. This ensures that any internal latch coupled to that input will be properly reset to the state in which it is ready to receive data.

An exemplary embodiment of the circuit also includes a voltage level maintaining means for weakly holding the input line at a fixed voltage level after the reset signal is no longer asserted until the input terminal is driven by an applied signal.

BRIEF DESCRIPTION OF THE DRAWING

FIG. 1 is a schematic circuit diagram of an exemplary embodiment of the present invention.

FIG. 2 is a schematic circuit diagram of a typical input latch circuit of the prior art.

FIGS. 3a–3c and FIGS. 4a–4c are graphs of voltage versus time at several locations in the prior art circuit of FIG. 2 for a power-on reset operation.

BEST MODE OF CARRYING OUT THE INVENTION

With reference to FIG. 1, an auto-clamping circuit in accord with the present invention is seen to connect to an input pin, pad or other terminal connection 11 of an integrated circuit. A conductive input line 13 is associated with that input terminal 11 and is coupled thereto. The input line 13 is in turn coupled to the rest of the integrated circuit, as for example in this embodiment via an output 15 of a NAND logic gate 25.

As noted above, during a reset operation, the input terminal 11 and its associated input line 13 may be required to be at a definite voltage potential corresponding to a digital logic level for a proper reset state of the circuit to be assured. For example, the line 15 may connect to an input latch whose state may be uncertain if the input terminal 11 is allowed to float. In FIG. 1, the circuit is clamped to a ground potential, but it could just as easily be clamped to some other voltage potential, such as Vcc. The auto-grounding circuit shown here ensures that the input line 13 is properly grounded during a reset operation.

Depending on the particulars of the integrated circuitry to which the input 11–15 is coupled, it may also be required that the voltage level established on the input line 13 be maintained until driven by a signal applied to the input terminal 11. The exemplary embodiment in FIG. 1 also weakly holds the input at a fixed voltage potential after the reset signal is de-asserted.

The auto-grounding circuit includes a pull-down transistor 17 functioning as an electronic switch for discharging the input line 13 to ground whenever a reset signal PORL is asserted. The pull-down transistor is coupled between the input line 13 and ground, and has a gate terminal 19 that is coupled to receive the reset signal PORL.

In this embodiment, the pull-down transistor 17 is an n-channel MOS field-effect transistor (or FET). Since the reset signal PORL is usually designed to be active low, an inverter 21 is provided with its output connected to the transistor's gate 19 and its input 23 receiving the reset signal PORL, so that the active low reset signal is first inverted to a logic high voltage level when it is asserted on the gate 19.

Whenever the reset signal PORL is asserted, the transistor 17 turns on and sinks current from the input line 13 to the ground. The transistor 17 is preferably strong in its conductance capability to rapidly pull the input line 13 down to ground. When the reset signal PORL is de-asserted (goes high), the transistor 17 turns off and then no longer actively discharges the input line 13.

The exemplary embodiment seen in FIG. 1 also includes voltage level maintaining circuitry comprising a NAND logic gate 25 and a second pull-down transistor 27. The NAND gate 25 has a first input coupled to the input line 13, a second input coupled to receive the reset signal PORL, and an output 15, which as noted above is coupled to any portion of the remainder of the integrated circuit. The second pull-down transistor 27 is, like pull-down transistor 17, coupled between the input line and ground. Transistor 27 has a gate terminal 29 coupled to the output 15 of the NAND gate 25.

Whenever the reset signal PORL is asserted, a logic high output on line 15 turns on the second pull-down transistor 27, which cooperates with the main pull-down transistor 17, in discharging the input line 13 to ground. When the reset signal PORL is de-asserted, the output 15 of NAND gate 25 is the logical inverse of the input line 13. When the input line 13 is at a logic low potential, the logic high output 15 turns on the second pull-down transistor 27, such that the input line 13 is maintained at that low level. When the input line 13 is at a logic high potential, the logic low output 15 turns off the second pull-down transistor 27 so that the input line 13 maintains its charge at the high logic level.

In order that the voltage level maintaining circuitry 25–29 not interfere with normal operation of the input terminal 11, the conductance capability of the second pull-down transistor 27 should be substantially weaker than that of the main pull-down transistor 17 of the auto-grounding circuit.

It will be recognized by those skilled in the art that other variations of the auto-grounding circuit from that of the exemplary embodiment are possible without departing from the essential nature of the invention just described. For example, if the reset signal is chosen to be active high, the inverter 21 will not be necessary. Likewise, a p-channel FET might be used in place of the pull-down transistor 17. Other logic gates might replace the NAND gate 25, with appropriate modifications.

What is claimed is:

1. An auto-clamping circuit responsive to a reset signal for tying an input terminal of an integrated circuit to a definite voltage potential, the auto-clamping circuit comprising:
   a conductive input line coupled to an input terminal;
   electronic switching means coupled between the input line and a voltage supply line, the electronic switching means effective for coupling the input line to the voltage supply line whenever a reset signal is asserted upon the electronic switching means; and
   a voltage level maintaining means also responsive to the reset signal and also coupled between the input line and the voltage supply line, but weaker in its conductance capability than the electronic switching means, for holding the input line at a fixed voltage potential once the reset signal is de-asserted until driven by a signal applied to the input terminal.

2. The auto-clamping circuit as in claim 1, wherein the voltage level maintaining means is a circuit comprising:
   a NAND logic gate having a first input coupled to the input line, a second input coupled to receive the reset signal, and an output coupled to any remaining portion of the integrated circuit; and
   a transistor coupled between the input line and the voltage supply line, and having a gate terminal coupled to the output of the NAND gate.

3. The auto-clamping circuit as in claim 1, wherein the voltage supply line is at ground potential.

4. An auto-clamping circuit responsive to a reset signal for tying an input terminal of an integrated circuit to a definite voltage potential, the auto-clamping circuit comprising:
   a conductive input line coupled to an input terminal; and
   electronic switching means coupled between the input line and a voltage supply line, the electronic switching means effective for coupling the input line to the voltage supply line whenever a reset signal is asserted upon the electronic switching means, wherein the electronic switching means comprises a transistor coupled between the input line and the voltage supply line, and having a gate terminal coupled to receive the reset signal.

5. The auto-clamping circuit as in claim 4, wherein the reset signal is an active low signal, the transistor is an n-channel FET, and an inverter is coupled to the gate terminal of the transistor for inverting the reset signal.

6. An auto-clamping circuit responsive to a reset signal for grounding an input terminal of an integrated circuit, the auto-clamping circuit comprising:
   a conductive input line coupled to an input terminal;
   a first pull-down transistor coupled between the input line and a ground, and having a gate terminal coupled to receive a reset signal, the pull-down transistor effective for discharging the input line to ground whenever the reset signal is asserted upon its gate terminal;
   a NAND logic gate having a first input coupled to the input line, a second input coupled to receive the reset signal, and an output coupled to any remaining portion of the integrated circuit; and
   a second pull-down transistor coupled between the input line and ground, and having a gate terminal coupled to the output of the NAND gate, the second pull-down transistor weaker in its conductance capability than the first pull-down transistor but effective for maintaining the input line at a fixed voltage potential once the reset signal is de-asserted until driven by a signal applied to the input terminal.

* * * * *